(12) United States Patent
Spitz et al.

(10) Patent No.: US 8,900,925 B2
(45) Date of Patent: Dec. 2, 2014

(54) METHOD FOR MANUFACTURING A DIODE, AND A DIODE

(71) Applicants: Richard Spitz, Reutlingen (DE); Alfred Goerlach, Kusterdingen (DE); Robert Kolb, Gross-Umstadt (DE)

(72) Inventors: Richard Spitz, Reutlingen (DE); Alfred Goerlach, Kusterdingen (DE); Robert Kolb, Gross-Umstadt (DE)

(73) Assignee: Robert Bosch GmbH, Stuttgart (DE)

( * ) Notice: Subject to any disclaimer, the term of this patent is extended or adjusted under 35 U.S.C. 154(b) by 4 days.

(21) Appl. No.: 13/921,362

(22) Filed: Jun. 19, 2013

(65) Prior Publication Data

US 2013/0341764 A1 Dec. 26, 2013

(30) Foreign Application Priority Data

Jun. 21, 2012 (DE) .......................... 10 2012 210 527

(51) Int. Cl.
| | |
|---|---|
| *H01L 21/44* | (2006.01) |
| *H01L 21/48* | (2006.01) |
| *H01L 21/50* | (2006.01) |
| *H01L 21/00* | (2006.01) |
| *H01L 21/76* | (2006.01) |
| *H01L 21/30* | (2006.01) |
| *H01L 21/46* | (2006.01) |
| *H01L 21/78* | (2006.01) |
| *H01L 21/301* | (2006.01) |
| *H01L 29/861* | (2006.01) |
| *H01L 29/66* | (2006.01) |
| *H01L 29/32* | (2006.01) |

(52) U.S. Cl.
CPC .......... *H01L 29/6609* (2013.01); *H01L 29/861* (2013.01); *H01L 29/32* (2013.01); *H01L 29/66136* (2013.01)
USPC ........... 438/114; 438/451; 438/458; 438/462; 438/68; 438/110

(58) Field of Classification Search
USPC ............ 438/113, 458, 462, 68, 110, 114, 451
See application file for complete search history.

(56) References Cited

U.S. PATENT DOCUMENTS

2013/0337633 A1* 12/2013 Seddon .......................... 438/462

FOREIGN PATENT DOCUMENTS

| DE | 10 2007 033 242 | 1/2009 |
|---|---|---|
| DE | 10 2010 032 029 | 1/2012 |

* cited by examiner

*Primary Examiner* — Matthew Reames
*Assistant Examiner* — Dilinh Nguyen
(74) *Attorney, Agent, or Firm* — Kenyon & Kenyon LLP

(57) ABSTRACT

In a method for manufacturing a diode, a semiconductor crystal wafer is used to produce a p-n or n-p junction, which extends in planar fashion across the top side of a semiconductor crystal wafer. Separation edges form perpendicularly to the top side of the semiconductor crystal wafer, which edges extend across the p-n or n-p junction. The separation of the semiconductor crystal wafer is achieved in that, starting from a disturbance, a fissure is propagated by local heating and local cooling of the semiconductor crystal wafer. The separation fissure thus formed extends along crystal planes of the semiconductor crystal, which avoids the formation of defects in the area of the p-n or n-p junction.

6 Claims, 2 Drawing Sheets

METHOD FOR MANUFACTURING A DIODE, AND A DIODE

BACKGROUND OF THE INVENTION

1. Field of the Invention

The present application relates to a method for manufacturing a diode and to a diode that has a p-n or n-p junction.

2. Description of the Related Art

Normally, such diodes are manufactured in that a semiconductor crystal wafer, for example a silicon wafer, is used in order to produce a p-n or n-p junction by the processes of diffusion or epitaxy. This junction is normally developed in a planar manner on a top side of the semiconductor crystal wafer, and, in a subsequent step, the semiconductor crystal wafer is separated into a plurality of individual diode chips. In the process, separation cuts are introduced, which extend from the top side of the semiconductor crystal wafer to the bottom side, and thus the semiconductor crystal wafer is separated into a great number of individual diode chips. Normally, the separation of the semiconductor crystal wafers occurs by a sawing process. Such a sawing process produces crystal defects in the area of the cut edges, which result in a deterioration of the properties of the diodes developed in this manner. For this reason, subsequent processing steps are required, which remove these crystal defects, for example etching the surface in order to remove this damaged crystal structure and/or subsequent temperature treatment steps.

Separation methods for separating brittle materials are already known from published German patent application document DE 10 2007 033 242 A1 or from published German patent application document DE 10 2010 032 029 A1. These separation processes entail the introduction of a mechanical disturbance in the semiconductor crystal and the formation of mechanical stresses by heating and cooling, a separating fissure then developing beginning at the disturbance.

BRIEF SUMMARY OF THE INVENTION

The method according to the present invention for manufacturing a diode and the diode according to the present invention have the advantage that the chosen separation method prevents or clearly reduces the development of crystal disruptions in the area of the separation edges. It is therefore no longer necessary to perform subsequent processing steps to remove the crystal damage that has occurred. Both subsequent etching processes as well as subsequent temperature treatments may therefore be omitted. A high-quality diode is thus created, which may be produced in very few processing steps. Furthermore, a possible contamination by etching chemicals is fundamentally prevented, which improves the longevity of the diode.

It is particularly simple to perform local heating by a laser beam and local cooling by a gas jet or water jet. The disturbances, which are the starting point of the fissure propagation, may be produced in a particularly simple manner by scoring, sawing or a laser. It is particularly advantageous that there is no subsequent processing by an etching process since thus additional contaminations of the diode are eliminated and the extra expenditure for such an etching process is not required.

DETAILED DESCRIPTION OF THE INVENTION

Figure 1:
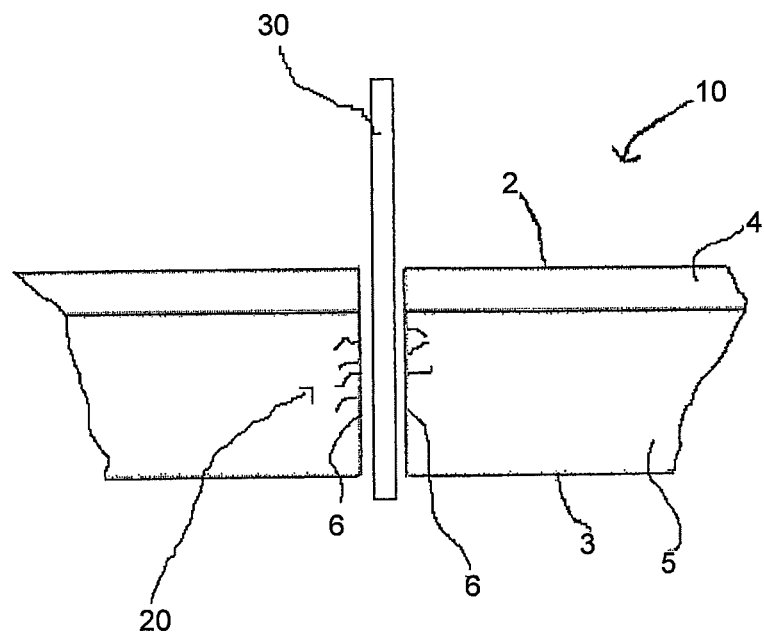
FIG. 1 shows a conventional manufacturing process for diodes.

FIG. 1 shows a conventional process step in the manufacture of diodes from a semiconductor material. Normally, diodes are manufactured in that a semiconductor crystal wafer 10, for example a silicon wafer, is used, and then a p-n or an n-p junction is produced by a process of diffusion or epitaxy. For example, starting from an n-doped silicon wafer, a p-n junction may be produced by a surface introduction or epitactic growth of a p-type doping. FIG. 1 shows in exemplary fashion a silicon wafer having an n-type doping into which a surface p-doping layer was introduced. The lateral view of FIG. 1 shows an n-doped layer 5 and a surface p-doping layer 4, which form a p-n junction. For the purpose of the description, the side on which p-doping layer 4 is applied is designated as top side 2 and the side of n-doping 5 is designated as bottom side 3. By using large-area semiconductor crystal wafers or silicon wafers, a plurality of diodes may be produced, semiconductor crystal wafer 10 or the silicon wafer then being separated into individual diodes 1 in a final process step.

FIG. 1 shows this process step of separation, i.e. the separation of the silicon wafer into a plurality of individual diodes 1 or diode chips. In the conventional process step, as is shown in FIG. 1, this occurs by a sawing process using a diamond saw blade 30, which separates the silicon wafer into a plurality of individual diode chips 1 starting from top side 2 or bottom side 3. FIG. 1 shows in exemplary fashion saw blade 30 during the sawing process.

The sawing process using saw blade 30 produces lateral walls or separation edges 6, which extend from top side 2 of the silicon wafer down to bottom side 3 of the silicon wafer. Since such a sawing process is a mechanical destruction of the crystal structure of the silicon wafer, microfissures 20 result in the area of the separation edges 6, which are shown in FIG. 1 by way of example.

When the p-n junction of diode chip 1 has voltage applied to it in the blocking direction, then a zone of a paucity of charge carriers is produced in the area of the p-n junction such that the desired blocking behavior of the diode is achieved. Due to crystal defects, however, individual charge carriers may be produced, which then result in a low current flow through the diode, even though the diode is poled in the blocking direction. This current flow in the blocking direction is called a blocking current and should be as low as possible since this blocking current causes an undesirable heating of the diode. An excessively high blocking current results in an increased aging of the diode and may lead to a failure of the diode. For critical applications it is therefore desirable for the blocking current of diodes to be as low as possible.

Since microfissures 20 are disturbances in the semiconductor crystal, which likewise result in the formation of charge carriers, such microfissures in the area of separation edges 6 result in an inadmissibly high blocking current, and therefore measures must be taken to remove microfissures 20 using a saw blade 3 following the separation process. This is typically achieved by an etching process using potassium hydroxide solution (KOH), which requires another process step in the manufacture of diodes. Furthermore, the etching agent represents a potential source of contaminations, which could affect either the diode itself or additional packaging material of the diode.

Figure 2:
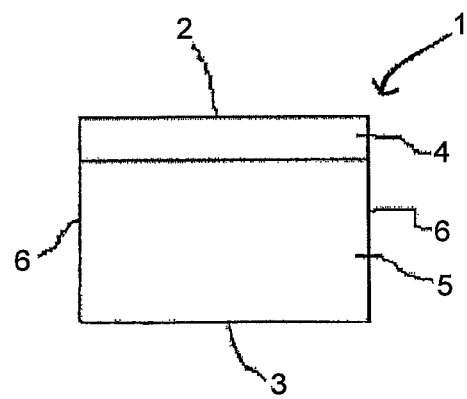
FIG. 2 shows an individual diode.

FIG. 2 shows a diode of the present invention having a top side 2 and a bottom side 3. A p-layer 4 is situated on top side 2, and an n-layer 5 extends from p-layer 4 down to bottom side 3 of diode 1. Possible metalization layers for electrically contacting p-layer 4 or n-layer 5 are not shown in the view of FIG. 2. In the top view onto top side 2, diode 1 is seen as a rectangle, which is bounded by four separation edges 6. The lateral view of FIG. 2 shows two separation edges 6. The present invention now provides for separation edges 6 to be developed, not by a sawing process, but by local heating and cooling, as described in subsequent FIGS. 3 through 5. As may be seen in the lateral view of FIG. 2, separation edges 6 here have no microfissures 20 since the separation process according to the present invention does not produce any microfissures in the semiconductor crystal. Hence there is also no subsequent etching step or temperature treatment step required in order to remove such microfissures of separation edges 6.

Figure 3:
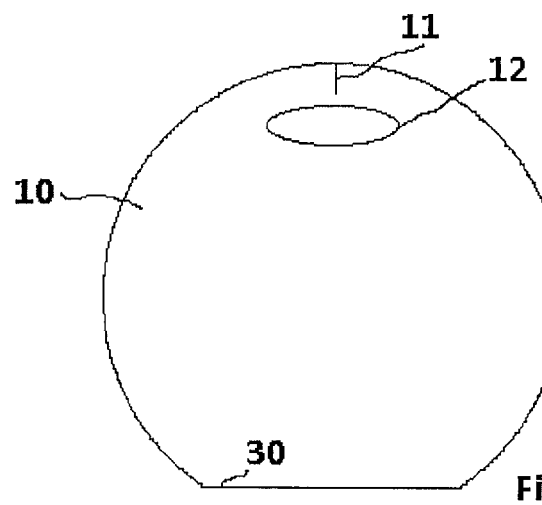
FIGS. 3 through 5 illustrate the manufacturing process according to the present invention.
Figure 4:
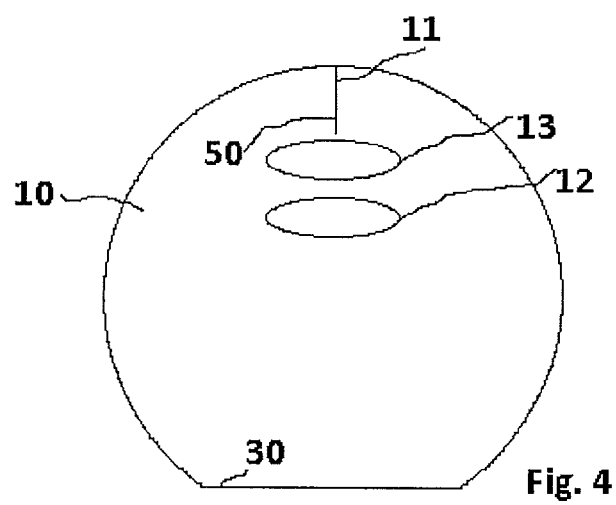
Figure 5:
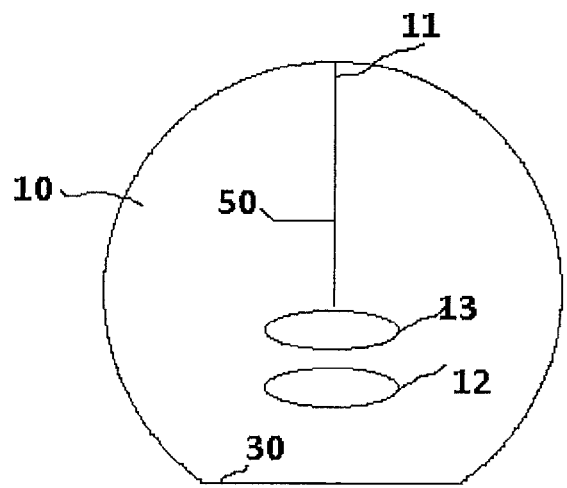

FIGS. 3 through 5 schematically show the method according to the present invention for manufacturing a diode.

FIG. 3 shows a top view onto a top side 3 of a semiconductor crystal wafer 10, for example a silicon wafer. In the top view, the silicon wafer takes the form of a circular disk, an area of the crystal disk, the so-called flat 30, having been cut off. On the opposite side of flat 30, a disturbance 11, represented as a small dash, was introduced on top side 3 of semiconductor crystal wafer 10. This disturbance 11, however, extends from the edge of semiconductor crystal wafer 10 only in a narrow edge region. It is essential in this regard that disturbance 11 does not cover a large area of semiconductor wafer 10 since the area into which the disturbance is introduced cannot be used for diodes. It is thus only a local disturbance 11 in an area of the semiconductor crystal wafer which, due to its proximity to the edge, normally cannot be used for manufacturing diodes. Disturbance 11 is a mechanical disturbance, i.e. an indentation or a fissure in the semiconductor crystal wafer. The introduction of local disturbance 11 may be achieved for example by mechanical processing such as scoring surface 3 using a diamond crystal or beginning to saw surface 3 of semiconductor crystal wafer 10. Alternatively it is also possible to produce disturbance 11 by laser processing, the strength of the laser beam being chosen in such a way that a removal of semiconductor material or another disturbance of the monocrystalline structure of the semiconductor material occurs.

In the immediate spatial proximity of disturbance 11, a heating zone 12 is now produced. Via this heating zone 12, semiconductor crystal wafer 10 is heated in an area directly in front of disturbance 11, without semiconductor crystal wafer 10 being heated over a large area. The heating results in an expansion of the semiconductor crystal, which is limited to the area of heating zone 12. This results in mechanical stresses through which a fissure may form in the semiconductor crystal beginning from disturbance 11 when the mechanical stresses exceed the strength of the semiconductor crystal. The brittleness of the material is essential for this purpose, i.e. the very limited possibility of reducing mechanical stresses by deformations. Furthermore, in the case of monocrystalline materials, the development of fissures depends greatly on the directions of the crystals or the crystal planes. In a monocrystalline material, a fissure due to mechanical stresses will preferably always form along certain crystal axes or crystal planes.

The mechanical stresses in the semiconductor crystal may be increased further if, in addition to the local heating zone 12, a local cooling zone 13 is situated in spatial proximity to the latter. This is shown in FIG. 4 in that starting from disturbance 11 in the direction of flat 30 first a cooling zone 13 and a heating zone 12 are shown. Starting from FIG. 3, the state of FIG. 4 was reached in that heating zone 12 was shifted on the surface of the semiconductor crystal wafer and additionally, starting from the edge or disturbance 11, the cooling zone 13 was moved over the surface of semiconductor crystal wafer 11. Alternatively, of course, semiconductor crystal wafer 10 may also be moved under a stationary device that produces a heating zone 12 and a cooling zone 13. These two zones produce mechanical stresses in the semiconductor crystal, which, starting from disturbance 11, result in the formation of a separation fissure 50.

If local heating zone 12 and local cooling zone 13 are shifted on the surface of semiconductor crystal wafer 10, a separation fissure 50 will develop starting from disturbance 11 across through the silicon monocrystal from top side 3 of semiconductor crystal wafer 10 to bottom side 5 of semiconductor crystal wafer 10. The propagation of this fissure, of separation fissure 50, along the direction of the movement of heating zone 12 and cooling zone 13 is shown accordingly in FIG. 5. The formation of this division fissure or separation fissure 50 thus results in a separation of semiconductor crystal wafer 10 into individual diode chips. Since the mechanical stresses preferably form a fissure along certain crystal planes, the fissures thus produced essentially represent smooth surfaces, which have no microfissures perpendicular to these surfaces. If this movement occurs along a suitable crystal axis, then separation fissure 50 essentially represents a crystal plane of the semiconductor crystal. Diodes produced in this manner thus have separation edges 6 that are essentially free of disturbances. Immediately after separation, these diodes therefore already have particularly low blocking currents since there are no sources of disturbance in the area of separation edges 6 which could contribute to the formation of blocking currents. Diodes 1 manufactured in this manner may therefore be used immediately, without subsequent processing steps for reworking the separation edges 6 being required.

The diodes manufactured in this manner thus have particularly smooth separation edges 6. These separation edges 6 furthermore bear no reworking traces from an etching process, in particular the cutting lines of top side 3 and of separation edge 6 being particularly straight and rectangular and there being no detectable etching residues or mechanically destroyed areas due to the sawing process. The diodes manufactured in this manner therefore have separation edges 6 that bear no traces of an etching process or a sawing process.

FIGS. 3 through 5 show in exemplary fashion only the formation of a separation fissure 50 through semiconductor crystal wafer 10. Accordingly, a further separation is performed along separation fissures perpendicular to this first separation step. DE 10 2010 032 029 A1 furthermore describes how these separation fissures are preferably introduced successively into a semiconductor crystal wafer 10.

What is claimed is:
1. A method for manufacturing a diode, comprising:
producing one of a p-n or n-p junction in a semiconductor crystal wafer, wherein the one of the p-n or n-p junction extends in planar fashion across a top side of the semiconductor crystal wafer; and
subsequently separating the semiconductor crystal wafer into individual diode chips in a separation process in which separation edges are formed perpendicularly to the top side of the semiconductor crystal wafer and extend across the one of the p-n or n-p junction;
wherein the separation process includes:
introducing a surface disturbance into a top surface of the semiconductor crystal wafer, wherein the surface disturbance is located at a peripheral edge of the crystal wafer, subsequently providing a local heating of a first area of the top surface spatially removed from the surface disturbance, and subsequently providing a local cooling of a second area of the top surface spatially removed from the first area and the surface disturbance, wherein the local heating followed by the local cooling achieve a fissure propagation due to mechanical stresses starting from the surface disturbance.

2. The method as recited in claim 1, further comprising:

after the local cooling of the second area, providing a local heating of a third area of the top surface spatially removed from the second area and the surface disturbance, and subsequently providing a local cooling of a fourth area of the top surface spatially removed from the third area and the surface disturbance.

3. The method as recited in claim 1, wherein at least one of (i) the local heating is achieved by a laser beam, and (ii) the local cooling is achieved by one of a water jet or gas jet.

4. The method as recited in claim 1, wherein the introduction of the local disturbance is achieved by one of a scoring process, a sawing process, or laser radiation.

5. The method as recited in claim 1, wherein the separation edges formed are not treated by a subsequent etching process.

6. A diode made in accordance with the method of claim 1, wherein the separation edges show no traces of an etching process following the separation.

* * * * *